United States Patent [19]

Tajima et al.

[11] Patent Number: 5,326,980
[45] Date of Patent: Jul. 5, 1994

[54] ION IMPLANTER WITH PLURAL SURFACE POTENTIAL SENSORS

[75] Inventors: Kazuhiro Tajima; Hideki Kimura, both of Kanagawa, Japan

[73] Assignee: Sony Corporation, Japan

[21] Appl. No.: 907,533

[22] Filed: Jul. 2, 1992

[30] Foreign Application Priority Data

Jul. 8, 1991 [JP] Japan .................. 3-166565
Jul. 17, 1991 [JP] Japan .................. 3-176327
Apr. 13, 1992 [JP] Japan .................. 4-091330

[51] Int. Cl.$^5$ ............................ H01J 37/30
[52] U.S. Cl. ................... 250/492.21; 250/397
[58] Field of Search ............ 250/492.21, 442.1, 397

[56] References Cited

U.S. PATENT DOCUMENTS

| | | | |
|---|---|---|---|
| 4,675,530 | 6/1987 | Rose et al. | 250/492.21 |
| 4,904,902 | 2/1990 | Tamai et al. | 250/492.2 |
| 4,914,292 | 4/1990 | Tamai et al. | 250/251 |
| 5,089,710 | 2/1992 | Kikuchi et al. | 250/492.21 |
| 5,138,169 | 8/1992 | Yamazaki et al. | 250/251 |
| 5,198,676 | 3/1993 | Benveniste et al. | 250/397 |

FOREIGN PATENT DOCUMENTS

| | | |
|---|---|---|
| 3623441 | 1/1987 | Fed. Rep. of Germany . |
| 2122538 | 5/1990 | Japan . |
| 2180093 | 3/1987 | United Kingdom . |

OTHER PUBLICATIONS

Patent Abstracts of Japan, vol. 15, No. 453 (E-1134) Nov. 18, 1991 and JP-A-03 192 646 (Tokyo Kasoode Kenkyusho).

*Primary Examiner*—Bruce C. Anderson
*Attorney, Agent, or Firm*—Ronald P. Kananen

[57] ABSTRACT

An ion implanter including an ion beam generator for irradiating an ion beam toward a rotary drum having a front surface with a number of substrates fixed and equally spaced circumferentially thereof. The rotary drum is supported for rotation and reciprocation so that the substrates are exposed in succession to the ion beam. A plurality of surface potential sensors are positioned adjacent the front surface of the rotary drum. The surface potential sensors are positioned at different angular distances with respect to the ion beam for generating surface potential signals in response to surface potentials on the respective substrates. The surface potential sensors may be positioned on a line extending in a direction of reciprocation of the rotary disc for producing surface potential signals in response to surface potentials at different positions on each of the substrates.

15 Claims, 4 Drawing Sheets

ION IMPLANTER WITH PLURAL SURFACE POTENTIAL SENSORS

BACKGROUND OF THE INVENTION

This invention relates to an ion implanter of the type rotating a rotary disc with a number of substrates fixed thereon to expose the substrates in succession to an ion beam.

Ion implanters have been used in producing semiconductor devices or liquid crystal display (LCD) devices. A conventional ion implanter includes a rotary disc having a number of substrates fixed thereon. During ion implantation, the rotary disc is rotated and reciprocated to expose the substrates in succession to an ion beam. Positive charges are induced in the substrate surface exposed to the ion beam. If the positive charges are accumulated to an excessive extent, a crack or a dielectric breakdown will occur in the substrate surface. In order to avoid such crack or dielectric breakdown, it is required to monitor the charge-up phenomenon in terms of the charges accumulated in the substrate surface by measuring the surface potential during the ion implantation. However, the conventional ion implanter employs a single surface potential sensor and cannot measure the surface potential with high accuracy.

SUMMARY OF THE INVENTION

Therefore, it is a main object of the invention to provide an improved ion implanter which can measure the surface potential with high accuracy.

There is provided, in accordance with the invention, an ion implanter comprising means for irradiating an ion beam, and a rotary drum having a front surface with a number of substrates fixed and equally spaced circumferentially thereof. The rotary drum is supported for rotation and reciprocation so that the substrates are exposed in succession to the ion beam. A plurality of surface potential sensors are positioned adjacent the front surface of the rotary drum. The surface potential sensors are positioned at different angular distances with respect to the ion beam for generating surface potential signals in response to surface potentials on the respective substrates.

In another aspect of the invention, there is provided an ion implanter comprising means for irradiating an ion beam, and a rotary drum having a front surface with a number of substrates fixed and equally spaced circumferentially thereof. The rotary drum is supported for rotation and reciprocation so that the substrates are exposed in succession to the ion beam. A plurality of surface potential sensors are positioned adjacent the front surface of said rotary drum. The surface potential sensors are positioned on a line extending in a direction of reciprocation of the rotary disc for producing surface potential signals in response to surface potentials at different positions on each of the substrates.

BRIEF DESCRIPTION OF THE DRAWINGS

The invention will be described in greater detail by reference to the following description taken in connection with the accompanying drawings, in which.

DETAILED DESCRIPTION OF THE INVENTION

Figure 5:
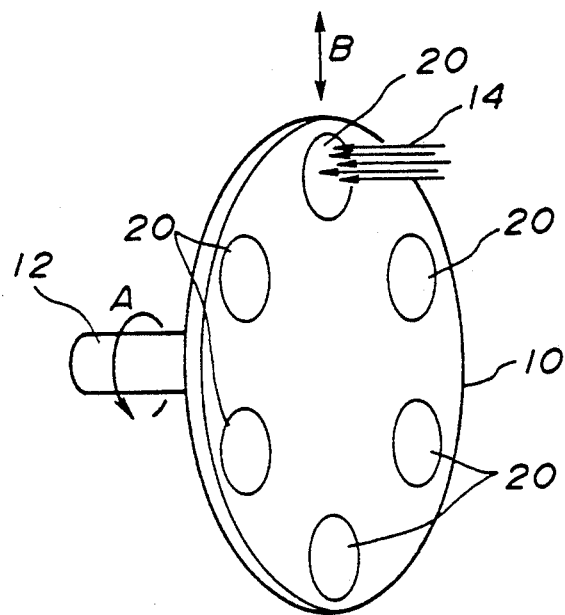
FIGS. 5 and 6 are perspective views showing a conventional ion implanter.
Figure 6:
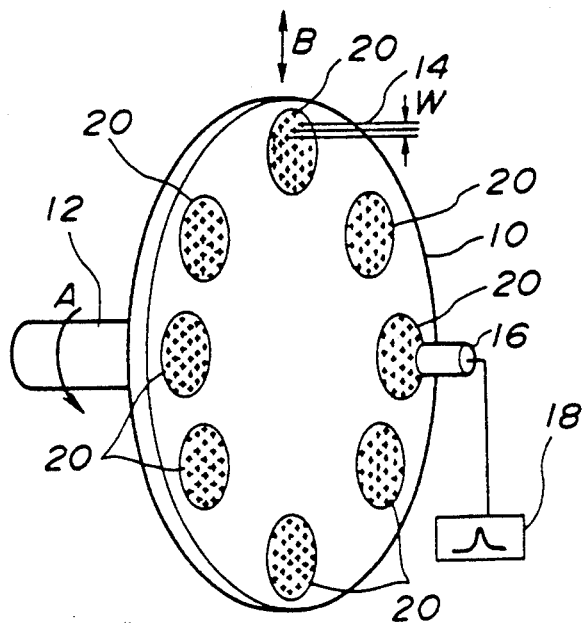

Prior to the description of the preferred embodiments of the present invention, the prior art ion implanter of FIGS. 5 and 6 are briefly described in order to provide a basis for a better understanding of the difficulties attendant thereon. In FIGS. 5 and 6, the conventional ion implanter includes a rotary disc 10 having a shaft 12 fixed centrally to its rear surface for rotation in unison therewith. The rotary disc 10 is supported for rotation in a direction indicated by the arrow A and reciprocation in the vertical directions indicated by the arrows B. The rotary disc 10 has a number of semiconductor wafers 20 fixed and equally spaced circumferentially on its front surface. An unshown ion beam generator is provided to irradiate an ion beam 14 toward the rotary disc 10 so as to produce an ion beam spot at a predetermined position on the front surface of the rotary disc 10. The ion beam spot is elongated at a width W in the direction of radius of the rotary disc 10. During ion implantation, the ion beam 14 is irradiated toward the rotary drum 10 rotated at a predetermined high speed in the direction indicated by the arrow A and reciprocated at a predetermined slow speed in the vertical directions indicated by the arrows B so as to scan the whole area of each of the wafer 20. Positive charges are induced in the wafer surface exposed to the ion beam 14. If the positive charges are accumulated to an excessive extent, a crack or a dielectric breakdown will occur in the wafer surface. In order to avoid such crack or dielectric breakdown, it is required to monitor the charge-up phenomenon in terms of the charges accumulated in the wafer surface by measuring the surface potential during the ion implantation.

For example, Japanese Patent Kokai No. 2-122538 discloses a conventional ion implanter which employs a single surface potential sensor 16, as shown in FIG. 6. The surface potential sensor 16 includes a capacitive probe positioned near the front surface of the rotary disc 10, and a field effect transistor having a gate electrode connected to the capacitive probe. When charges are induced in the capacitive probe, the electric field around the gate electrode of the field effect transistor changes to an extent corresponding to the induced charges and thus to the surface potential of the wafer 20. The measured surface potential is outputted to a display unit 18.

With such a conventional surface potential sensor 16, however, a sufficient time, for example, about 43 msec, elapses for a wafer 20 to be exposed to the ion beam 14 and to arrive at the position where the surface potential sensor 16 senses the surface potential of the wafer 20. The charged wafer 20 will be discharged in this time to introduce an error into the surface potential value measured by the surface potential sensor 16. It may be considered to place the surface potential sensor 16 near the position at which the wafer 20 is exposed to the ion beam 14. At this position, however, the behavior of the surface potential sensor 16 in terms of operating accuracy is directly affected by charged particles.

Figure 7A:
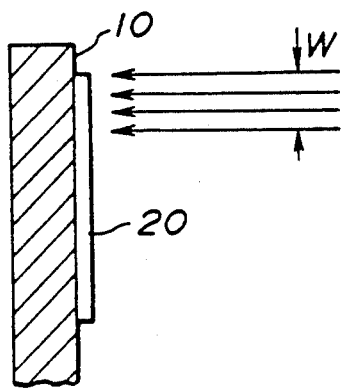
FIG. 7A is a sectional view showing the ion beam irradiated onto the wafer with the rotary drum at its lowermost position.
Figure 7B:
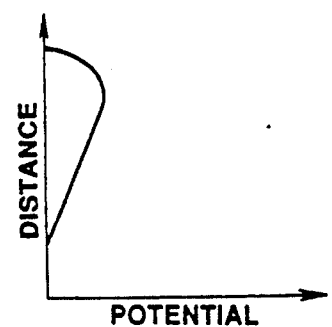
FIG. 7B is a graph of the distance from the lowermost position of the wafer versus surface potential.
Figure 8A:
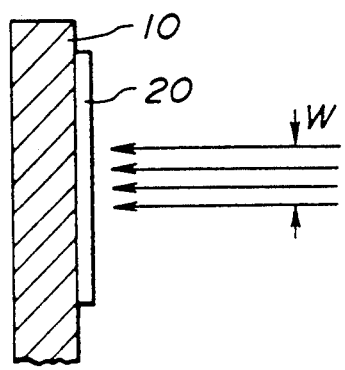
FIG. 8A is a sectional view showing the ion beam irradiated onto the wafer with the rotary drum at its intermediate position.
Figure 8B:
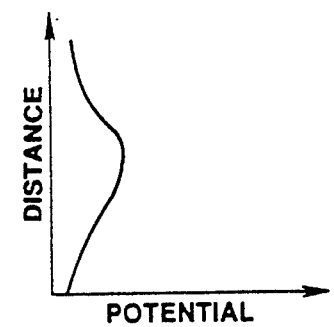
FIG. 8B is a graph of the distance from the lowermost position of the wafer versus surface potential.
Figure 9A:
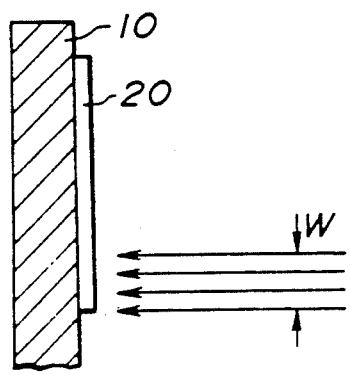
FIG. 9A is a sectional view showing the ion beam irradiated onto the wafer with the rotary drum at its uppermost position.
Figure 9B:
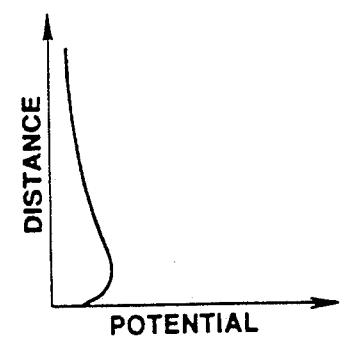
FIG. 9B is a graph of the distance from the lowermost position of the wafer versus surface potential.

Another problem attendant on the conventional ion implanter is that the position at which the wafer 20 is exposed to the ion beam 14 changes with time to introduce an error into the surface potential value measured by the surface potential sensor 16. That is, the position at which the surface potential sensor 16 is directed to a wafer 20 is deviated from the position at which the wafer 20 has been exposed to the ion beam 14 since the rotary disc 10 is reciprocating in the vertical directions indicated by the arrows B with a predetermined stroke so that the ion beam 14 can scan the whole area of each of the wafers 20 fixed thereon. FIG. 7A shows the wafer 20 having its upper portion exposed to the ion beam 14 with the rotary disc 10 at its lowermost position. The surface potential is higher in the upper portion exposed to the ion beam 14 than in the other portion of the wafer 20, as shown in FIG. 7B. FIG. 8A shows the wafer 20 having its intermediate portion exposed to the ion beam 14 with the rotary disc 10 at its intermediate position. The surface potential is higher in the intermediate portion exposed to the ion beam 14 than in the other portion of the wafer 20, as shown in FIG. 8B. FIG. 9A shows the wafer 20 having its lower portion exposed to the ion beam 14 with the rotary disc 10 at its uppermost position. The surface potential is higher in the lower portion exposed to the ion beam 14 than in the other portion of the wafer 20, as shown in FIG. 9B. When the position at which the surface potential sensor 16 is directed to a wafer 20 is deviated from the position at which the wafer 20 has been exposed to the ion beam 14, it is impossible, with the use of a single surface potential sensor 16, to measure the surface potential with high accuracy.

Figure 1:
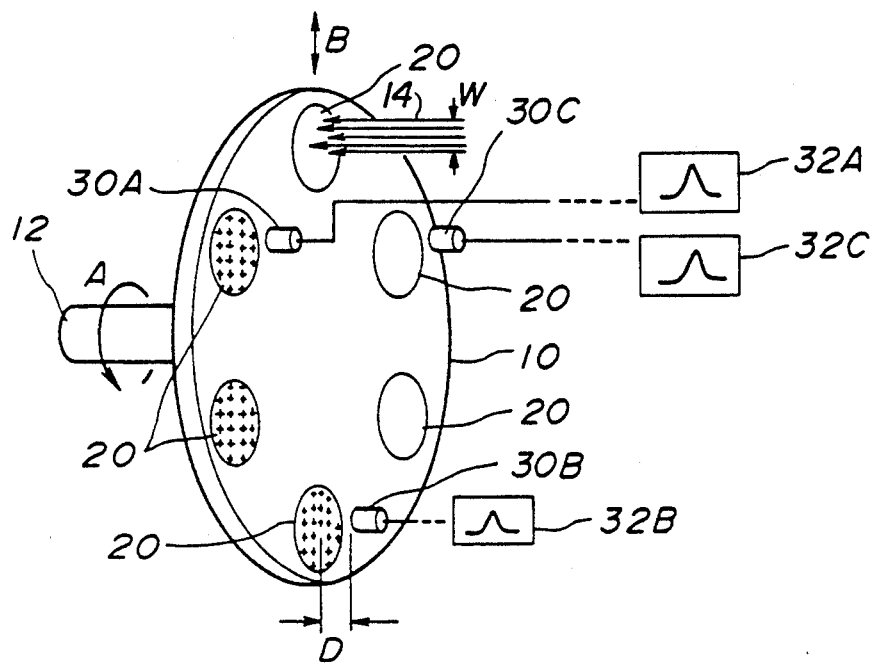
FIG. 1 is a perspective view showing one embodiment of an ion implanter made in accordance with the invention.

Referring to FIG. 1, there is shown a first embodiment of an ion implanter made in accordance with the invention. The ion implanter includes a rotary disc 10 having a shaft 12 fixed centrally to its rear surface for rotation in unison therewith. The rotary disc 10 is supported for rotation in a direction indicated by an arrow A and reciprocation in the vertical directions indicated by arrows B. The rotary disc 10 has a number of semiconductor wafers 20 fixed and equally spaced circumferentially on its front surface. An ion beam generator (not shown) is provided to irradiate an ion beam 14 so as to produce an ion beam spot at a predetermined position on the front surface of the rotary disc 10. The ion beam spot is elongated at a width W in the direction of a radius of the rotary disc 10. The ion implanter also includes a plurality of (in the illustrated case three) surface potential sensors 30A, 30B and 30C positioned at a short distance D from the front surface of the rotary disc 10. The surface potential sensors 30A, 30B and 30C are equally spaced circumferentially of the rotary drum 10. For example, the first surface potential sensor 30A is placed at an angular distance of about 60° with respect to the ion beam 14, the second surface potential sensor 30B is placed at an angular distance of about 180° with respect to the ion beam 14, and the third surface potential sensor 30C is placed at an angular distance of about 300°, as shown in FIG. 1. The surface potential sensors 30A, 30B and 30C, each of which is substantially the same as described in connection with FIG. 6, are directed to measure the surface potential at the center of each of the wafers 20. The surface potential sensors 30A, 30B and 30C are connected to respective display units 32A, 32B and 32C.

During ion implantation, the ion beam 14 is irradiated toward the rotary drum 10 rotated at a high speed (for example, 1000 rpm) in the direction indicated by the arrow A and reciprocated at a slow speed (for example, 15 to 30 seconds per stroke) in the vertical directions indicated by the arrows B so as to scan each of the wafers 20. When a semiconductor wafer 20 arrives at the predetermined position, it is exposed to the ion beam 14 irradiated from the ion beam generator. As a result, the wafer 20 has charges induced in its surface. When the rotary drum 10 rotates at an angle of about 60° in the direction indicated by the arrow A, the wafer 20 arrives at the position with its center facing to the first surface potential sensor 30A. The first surface potential sensor 30A senses the potential V1 on the surface of the wafer 20 and produces an electric signal corresponding to the sensed surface potential V1. This electric signal is fed to display the sensed surface potential V1 on the display unit 32A. It is to be noted that a predetermined time has elapsed for the wafer 20 to be exposed to the ion beam 14 and to face to the first surface potential sensor 30A. The wafer 20 is discharged to some extent in this predetermined time.

When the rotary drum 10 rotates further at an angle of about 120° in the direction indicated by the arrow A, the wafer 20 arrives at the position with its center facing to the second surface potential sensor 30B. The second surface potential sensor 30A senses the potential V2 on the surface of the wafer 20 and produces an electric signal corresponding to the sensed surface potential V2. This electric signal is fed to display the sensed surface potential V2 on the display unit 32B. It is to be noted that a predetermined time has elapsed for the wafer 20 to be exposed to the ion beam 14 and to face to the second surface potential sensor 30B. The wafer 20 is discharged to some extent in this predetermined time.

When the rotary drum 10 rotates further at an angle of 120° in the direction indicated by the arrow A, the wafer 20 arrives at the position with its center facing to the third surface potential sensor 30C. The third surface potential sensor 30C senses the potential V3 on the surface of the wafer 20 and produces an electric signal corresponding to the sensed surface potential V3. This electric signal is fed to display the sensed surface potential V3 on the display unit 32C. It is to be noted that a predetermined time has elapsed for the wafer 20 to be exposed to the ion beam 14 and to face to the third surface potential sensor 30C. The wafer 20 is discharged to some extent in this predetermined time.

The extent to which the wafer 20 is discharged is determined by the lapse of time after the wafer 20 is exposed to the ion beam 14 and the time constant $\tau$ dependent on the material of the wafer surface. When the wafer 20 is discharged in a time t after it is exposed to the ion beam 14, the surface potential V is given as $$V = V_0 \exp(-t/\tau)$$

where $V_0$ is the initial surface potential produced when $t=0$, that is, when the wafer 20 is exposed to the ion beam 14.

Figure 2:
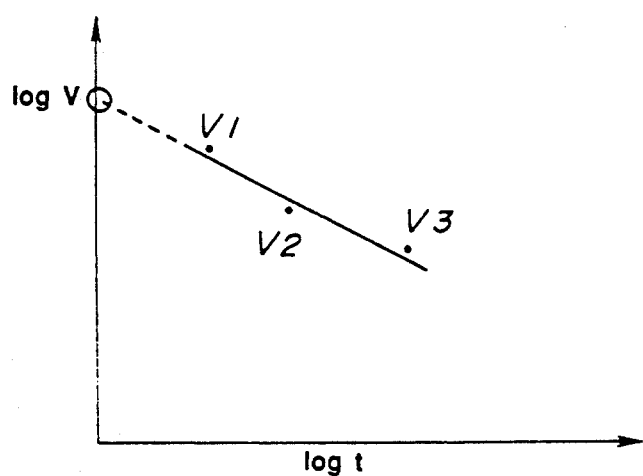
FIG. 2 is a graph of the logarithm of the surface potential versus the logarithm of the time lapse.

FIG. 2 is a graph obtained by plotting the logarithm of the lapse of time t against the logarithm of the surface potential V. As can be seen from FIG. 2, the logarithms of the surface potentials V1, V2 and V3 lie approximately on a line. It is, therefore, possible to estimate the initial surface potential $V_0$ from the measured surface potentials V1, V2 and V3. For this purpose, the surface potential sensors 30A, 30B and 30C are connected to a computer which calculates the initial surface potential $V_0$ based upon the measured surface potentials V1, V2 and V3.

Although the ion implanter has been described in connection with three surface potential sensors 30A, 30B and 30C, it is to be understood that the ion implanter may employ at least two surface potential sensors to calculate the initial surface potential $V_0$.

Figure 3:
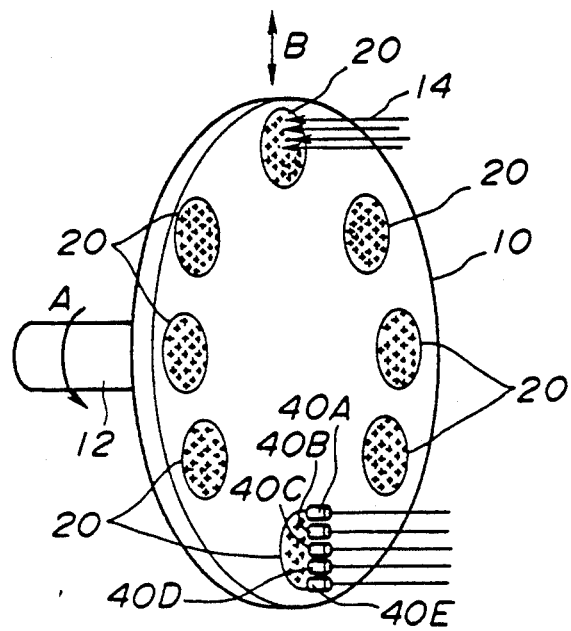
FIG. 3 is a perspective view showing a second embodiment of the ion implanter of the invention.
Figure 4:
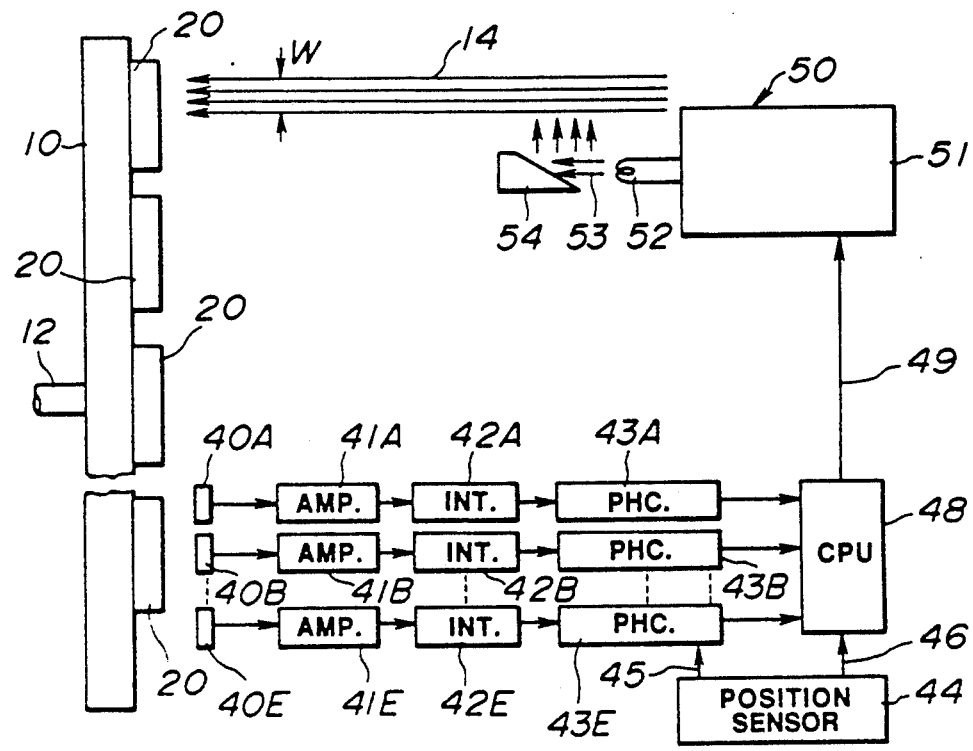
FIG. 4 is a schematic diagram of the electric components used in the ion implanter of FIG. 3.

Referring to FIGS. 3 and 4, there is shown a second embodiment of the ion implanter of the invention. In this embodiment, the three surface potential sensors 30A, 30B and 30C are removed and replaced with five surface potential sensors 40A, 40B, 40C, 40D and 40E. The surface potential sensors 40A, 40B, 40C, 40D and 40E are equally spaced on a radial line spaced at an angular distance of about 180° away from the ion beam 14 for measuring the surface potentials of each of the wafers 20 at different points lying on a line extending in the direction of reciprocation of the rotary disc 10, as shown in FIGS. 3 and 4. The surface potential sensors 40A, 40B, 40C, 40D and 40E are spaced at a predetermined distance D away from the front surface of the rotary disc 10.

During ion implantation, the ion beam 14 is irradiated toward the rotary drum 10 rotated at a high speed (for example, 1000 rpm) in the direction indicated by the arrow A and reciprocated at a slow speed (for example, 15 to 30 seconds per stroke) in the vertical direction indicated by the arrows B so as to scan each of the wafers 20. When a semiconductor wafer 20 arrives at the predetermined position, it is exposed to the ion beam 14 irradiated from the ion beam generator. As a result, the wafer 20 has charges induced in its surface. When the rotary drum 10 rotates at an angle of about 180° in the direction indicated by the arrow A, the wafer 20 arrives at the position with its radial diameter facing to the five surface potential sensors 40A, 40B, 40C, 40D and 40E. Although the position at which the ion beam 14 is irradiated on the wafer 20 changes with reciprocation of the rotary drum 10 in the vertical directions, this irradiated position will face to either of the five surface potential sensors 40A, 40B, 40C, 40D and 40E.

The surface potential sensors 40A, 40B, 40C, 40D and 40E, which are substantially the same as described in connection with FIG. 6, measure the surface potentials at the respective positions and produce electric signals corresponding to the respective sensed surface potentials. These electric signals are fed to respective preamplifiers 41A, 41B, 41C, 41D and 41E where they are amplified. The amplified signals are fed to respective integrating circuits 42A, 42B, 42C, 42D and 42E where they are integrated. The integrated signals are fed to respective peak hold circuits 43A, 43B, 43C, 43D and 43E which sample the peak values of the respective integrated signals. The sampled peak values are transferred to a digital computer 48. A scanning position sensor 44 produces scanning position signals 45 to control the sampling operations of the respective peak hold circuits 43A, 43B, 43C, 43D and 43E and also a scanning position signal 46 to the digital computer 48. The digital computer 48 calculates the surface potential of the wafer 2 at the position where the wafer 2 is exposed to the ion beam 14 and produces a control signal 49 based upon the peak values transferred thereto from the peak hold circuits 43A, 43B, 43C, 43D and 43E and the scanning position signal 46 fed thereto from the scanning position sensor 44.

An electron supply unit, generally designated by the numeral 50, includes an electron shower power supply 51 responsive to the control signal fed thereto from the digital computer 48 for supplying a controlled amount of power to cause an electron emitter 52 to emit an electron beam 53 toward a reflector 54. The electron beam 53 reflected on the reflector 54 is injected into the ion beam 14 to neutralize the charges induced on the wafer 20 so as to minimize the wafer surface potential. The extent to which the wafer surface potential is neutralized is determined by the amount of power supplied from the electron shower power source 51 to the electron emitter 52 and thus the surface potential calculated in the digital computer 48.

While the ion implanter has been described in connection with five surface potential sensors 40A, 40B, 40C, 40D and 40E, it is to be understood that the number of the surface potential sensors is not limited in any way five.

While the invention has been described in conjunction with specific embodiments thereof, it is evident that many alternatives, modifications and variations will be apparent to those skilled in the art. For example, although the wafers 20 have been described as semiconductor wafers, they are not limited to semiconductor wafers and may be other substrates such as quartz substrates. Accordingly, it is intended to embrace all alternatives, modifications and variations that fall within the scope of the appended claims.

What is claimed is:

1. An ion implanter comprising:
   means for irradiating an ion beam;
   a rotary disc having a front surface with a number of substrates fixed and equally spaced circumferentially thereon, said rotary disc being supported for rotation and reciprocation so that said substrates are exposed in succession to the ion beam;
   a plurality of surface potential sensors positioned adjacent said front surface of said rotary disc, said surface potential sensors being respectively positioned at different angular distances with respect to the ion beam for generating a plurality of respective surface potential signals in response to surface potentials at said different angular distances on said respective substrates; and
   means responsive to the respective surface potential signals for estimating a surface potential produced on each of said substrates when said each substrate is exposed to the ion beam.

2. The ion implanter as claimed in claim 1, further including means responsive to the surface potential signals from said respective surface potential sensors for displaying the surface potentials on said substrates passing said respective potential sensors.

3. The ion implanter as claimed in claim 1, further including means responsive to the respective surface potential signals for controlling charges induced on the respective substrates.

4. An ion implanter comprising:
   means for irradiating an ion beam;
   a rotary disc having a front surface with a number of substrates fixed and equally spaced circumferentially thereof, said rotary drum being supported for rotation and reciprocation so that said substrates are exposed in succession to the ion beam;
   a plurality of surface potential sensors positioned adjacent said front surface of said rotary disc, said surface potential sensors being respectively positioned at different positions on a line extending in a direction of reciprocation of said rotary disc for producing a plurality of respective surface potential signals in response to surface potentials at said different positions on each of said substrates; and
   means responsive to the respective surface potential signals for estimating a surface potential produced on each of said substrates at a time at which and at a position where each substrate is exposed to the ion beam.

5. The ion implanter as claimed in claim 4, further including means responsive to the surface potential signals from said surface potential sensors for respectively displaying the surface potentials at said respective different positions on said each substrate passing said surface potential sensors.

6. The ion implanter as claimed in claim 4, further including means responsive to the respective surface potential signals for controlling charges induced on the respective substrates.

7. An ion implanter, comprising:
   a rotary disc supported for rotation about an axis and reciprocation along a line and having a surface having a plurality of substrates fixed on said surface of said rotary disc at spaced intervals so that said substrates are positioned to be successively irradiated with an ion beam;
   means for selectively rotating and reciprocating said rotary disc;
   means for irradiating an ion beam to produce an ion beam spot at a predetermined position at said surface of said rotary disc so that said plurality of substrates are each irradiated with said ion beam at an irradiation target location;
   a plurality of surface potential sensors respectively positioned adjacent said surface of said rotary disc at predetermined locations relative to said irradiation target location to measure surface potential at a surface of each of said plurality of substrates after irradiation, each of said plurality of surface potential sensors respectively producing a surface potential signal representative of said surface potential on said substrate at said location of said surface potential sensor; and
   means responsive to the respective surface potential signals for estimating a surface potential produced on each of said angularly-spaced substrates when said each substrate is exposed to the ion beam.

8. The ion implanter as set forth in claim 7 wherein said predetermined locations at which said plurality of said surface potential sensors are located are angular spaced at predetermined angular distances relative to said irradiation target location and said substrates are fixed at said predetermined angular distances.

9. The ion implanter as set forth in claim 8 wherein said predetermined angular distances are equal.

10. The ion implanter as claimed in claim 8, further including means responsive to the surface potential signals from said angularly-spaced respective surface potential sensors for displaying the surface potentials on said substrates passing said respective angularly-spaced potential sensors.

11. The ion implanter as claimed in claim 8, further including means responsive to the respective surface potential signals for controlling charges induced on the respective angularly-spaced substrates.

12. The ion implanter as set forth in claim 7 wherein said predetermined locations at which said plurality of said surface potential sensors are located are linearly-spaced at predetermined linear distances relative to said irradiation target location and said substrates are fixed at predetermined angular distances.

13. The ion implanter as set forth in claim 12 wherein said predetermined angular distances are equal.

14. The ion implanter as claimed in claim 12, further including means responsive to the surface potential signals from said linearly-spaced respective surface potential sensors for displaying the surface potentials on said substrates passing said respective angularly-spaced potential sensors.

15. The ion implanter as claimed in claim 12, further including means responsive to the respective surface potential signals for controlling charges induced on the respective angularly-spaced substrates. h

* * * * *